United States Patent
Notzel

(10) Patent No.: US 12,009,455 B2
(45) Date of Patent: Jun. 11, 2024

(54) InGaN-BASED LED EPITAXIAL WAFER AND FABRICATION METHOD THEREOF

(71) Applicant: UNIV SOUTH CHINA NORMAL, Guangdong (CN)

(72) Inventor: Richard Notzel, Guangzhou (CN)

(73) Assignee: UNIV SOUTH CHINA NORMAL, Guangdong (CN)

(*) Notice: Subject to any disclaimer, the term of this patent is extended or adjusted under 35 U.S.C. 154(b) by 402 days.

(21) Appl. No.: 17/429,611

(22) PCT Filed: Mar. 13, 2019

(86) PCT No.: PCT/CN2019/078033
§ 371 (c)(1),
(2) Date: Aug. 9, 2021

(87) PCT Pub. No.: WO2020/181535
PCT Pub. Date: Sep. 17, 2020

(65) Prior Publication Data
US 2022/0115560 A1   Apr. 14, 2022

(30) Foreign Application Priority Data
Mar. 8, 2019 (CN) .......................... 201910177234.6

(51) Int. Cl.
*H01L 33/14* (2010.01)
*H01L 33/00* (2010.01)
(Continued)

(52) U.S. Cl.
CPC ............ *H01L 33/14* (2013.01); *H01L 33/007* (2013.01); *H01L 33/0087* (2013.01);
(Continued)

(58) Field of Classification Search
CPC ... H01L 33/14; H01L 33/007; H01L 33/0087; H01L 33/28; H01L 33/32; H01L 33/0066; H01L 33/0075; H01L 33/42; H01L 33/06
See application file for complete search history.

(56) References Cited

U.S. PATENT DOCUMENTS

2004/0245535 A1   12/2004   D'Evelyn et al.
2011/0073888 A1   3/2011   Ueno et al.
(Continued)

FOREIGN PATENT DOCUMENTS

| CN | 102268706 A | 12/2011 |
| CN | 102610687 A | 7/2012 |

(Continued)

OTHER PUBLICATIONS

CN 102268706 (Year: 2011).*
First Office Action for CN201910177234.6 (with English translation), mailed Jan. 11, 2021, 13 pages.
International Search Report for PCT/CN2019/078033, mailed Dec. 5, 2019, 5 pages.
(Continued)

*Primary Examiner* — Patricia D Valenzuela
(74) *Attorney, Agent, or Firm* — Klarquist Sparkman, LLP

(57) ABSTRACT

An InGaN-based LED epitaxial wafer and a fabrication method thereof are disclosed, wherein the InGaN-based LED epitaxial wafer includes: a substrate; an InGaN layer, formed on a surface of the substrate, having an In content between 40% and 90%, so as to ensure that the LED epitaxial wafer is capable of emitting long-wavelength light or near-infrared rays; a p-type metal oxide layer, formed on a surface of the InGaN layer facing away from the substrate, acting as a hole injection layer for the InGaN layer.

10 Claims, 2 Drawing Sheets

(51) Int. Cl.
  *H01L 33/28* (2010.01)
  *H01L 33/32* (2010.01)
  *H01L 33/06* (2010.01)
  *H01L 33/42* (2010.01)

(52) U.S. Cl.
  CPC .............. *H01L 33/28* (2013.01); *H01L 33/32* (2013.01); *H01L 33/06* (2013.01); *H01L 33/42* (2013.01)

(56) References Cited

U.S. PATENT DOCUMENTS

| | | | |
|---|---|---|---|
| 2013/0069191 | A1 | 3/2013 | Or-Bach et al. |
| 2015/0008390 | A1 | 1/2015 | Lewis et al. |
| 2018/0062043 | A1* | 3/2018 | Hisao ............. H01L 33/42 |
| 2019/0198562 | A1* | 6/2019 | Schubert ......... G01R 19/16533 |

FOREIGN PATENT DOCUMENTS

| | | |
|---|---|---|
| CN | 103346229 A | 10/2013 |
| CN | 105789399 A | 7/2016 |
| CN | 107785467 A | 3/2018 |

OTHER PUBLICATIONS

Written Opinion of the International Searching Authority for PCT/CN2019/078033, mailed Dec. 5, 2019, 3 pages.

Communication under Rule 71(3) EPC (Intention to Grant) issued in European Application No. 19 919 047.1, dated May 24, 2023, 20 pages.

Communication pursuant to Article 94(3) EPC issued in European Application No. 19 919 047.1, dated Feb. 11, 2022, 5 pages.

European Search Report issued in European Application No. 19919047.1, dated Jan. 31, 2022, 2 pages.

Peng et al., "Room-temperature ferromagnetism and electrical properties of $Cu_2O$/GaN heterostructures," *Journal of Physics D: Applied Physics*, 43 (2010) 315101 (4pp).

\* cited by examiner

InGaN-BASED LED EPITAXIAL WAFER AND FABRICATION METHOD THEREOF

CROSS REFERENCE TO RELATED APPLICATIONS

This is the U.S. National Stage of International Application No. PCT/CN2019/078033, filed Mar. 13, 2019, which was published in English under PCT Article 21(2), which in turn claims the benefit of Chinese Application No. 201910177234.6, filed Mar. 8, 2019.

TECHNICAL FIELD

The present disclosure relates to the field of semiconductor light emitting diodes (LEDs), particularly to an InGaN-based LED epitaxial wafer and a fabrication method thereof.

BACKGROUND ART

A light emitting diode is referred to as LED for short. Among semiconductors made from compounds of e.g. gallium (Ga), arsenic (As), phosphorus (P), and nitrogen (N), p-type semiconductors provide holes, and n-type semiconductors provide electrons, and when the electrons are recombined with the holes, visible light can be emitted, therefore, the above semiconductors can be used to manufacture light emitting diodes, as indicator lamps in circuits and instruments, or displayed as characters or digits in combination. The emitted light color (frequency or wavelength) depends upon bandgap width of the semiconductor materials, and generally, a wider bandgap width brings about greater energies (higher frequency) of emitted photons, as well as a shorter wavelength.

InGaN now has been widely used in the field of LEDs. Moreover, it is considered as one of the most promising LED semiconductor materials. This is because the bandgap width of the InGaN semiconductor material will be changed with an alloying content of an element In therein. Specifically, when the In content is increased, the bandgap width thereof becomes smaller, and correspondingly, the wavelength of emitted light becomes longer. Therefore, the bandgap width of InGaN can be changed by adjusting the In content therein, and further the emitted light color is determined. A great advantage of InGaN as semiconductor material is that it has a widest bandgap tunability (adjustment range) among III-V semiconductors. Theoretically, by adjusting the In content in InGaN, application of InGaN-based LEDs can be extended to red and near-infrared bands, even to 1.3 and 1.55 micrometer telecom bands.

Initially, InGaN is mostly used for LEDs with blue band. Recently, there is increasing interest to extend the application of the InGaN-based LEDs to the red and near-infrared bands, even to the 1.3 and 1.55 micrometer telecom bands. This requires InGaN with high In content so as to be capable of emitting red light or even reach a range of telecom bands. Moreover, high n- and p-type conductivity is required for direct contact and carrier injection layers. While high n-type conductivity is readily achieved, high p-type conductivity is considered to be quite difficult for In-rich InGaN. The reason is that unintentionally doped In-rich InGaN has defects in itself, and such defects usually act as donors such that InGaN with high defect density is always highly n-type conductive. Therefore, the unintentionally doped In-rich InGaN can only be converted to be p-type conductive by high intentional p-type doping, thereby limiting p-type conductivity thereof. Moreover, there is an intrinsic electron surface accumulation layer for In-rich InGaN hampering direct p-type contact.

In order to solve the above problems, a widely used solution is introducing a contact/hole injection layer to the In-rich InGaN layer, so as to improve the hole injection efficiency as well as the p-type conductivity. The contact/hole injection layer is usually wide bandgap low-In-content (<30%) p-type InGaN or pure GaN.

This, however, leads to large band offsets and does not allow reducing an operation voltage compared to wide bandgap low-In-content structures (blue or green LEDs). Moreover, such wide bandgap layers need to be grown onto an In-rich InGaN layer at a temperature of 600-800° C. for obtaining good crystal quality with required p-type conductivity. However, the temperature required in this process is far above a decomposition temperature of In-rich InGaN (about 500° C.). That is to say, it is quite hard to form high quality p-type InGaN or pure GaN within a low temperature range preventing decomposition of In-rich InGaN.

However, at the moment there are still no good solutions to avoid use of low-In-content (In)GaN wide bandgap p-type contact/hole injection layers, thus corrupting the development of efficient long wavelength emitting InGaN-based LED devices.

SUMMARY

The objects of the present disclosure include providing an LED semiconductor capable of emitting long-wavelength light.

The objects of the present disclosure further include avoiding wide bandgap low-In-content p-type InGaN or pure GaN as a hole injection layer.

The present disclosure also provides a fabrication method for LED semiconductors capable of emitting long-wavelength light.

In one aspect, the present disclosure provides an InGaN-based LED epitaxial wafer, including: a substrate; an InGaN layer, formed on a surface of the substrate, having an In content between 40% and 90%, so as to ensure that the LED epitaxial wafer is capable of emitting long-wavelength light or near-infrared rays; a p-type metal oxide layer, formed on a surface of the InGaN layer facing away from the substrate, acting as a hole injection layer for the InGaN layer.

Optionally, the p-type metal oxide layer is a $Cu_2O$ layer.

Optionally, the InGaN layer is a uniform/homogeneous layer of uniform In content or a heterostructure layer of varying In content. The InGaN layer can also have any morphology, such as planar layer, corrugated layer, nanowall network, nanocolumns.

Optionally, a material of the substrate is one selected from sapphire, Si, SiC, and GaN.

Optionally, the p-type metal oxide has to be chosen that the p-type metal oxide layer has a bandgap which straddles the bandgap of the InGaN layer, so as to ensure hole injection efficiency of the p-type metal oxide layer.

In another aspect, the present disclosure further provides a fabrication method for an InGaN-based LED epitaxial wafer, characterized by including: providing a substrate; epitaxially growing an InGaN layer on a surface of the substrate; and depositing and forming a p-type metal oxide layer on a surface of the InGaN layer facing away from the substrate.

Optionally, a manner of depositing and forming the p-type metal oxide layer is one selected from: thermal growth, sputtering, and electrodeposition.

Optionally, the p-type metal oxide layer is a $Cu_2O$ layer; and the p-type metal oxide layer is deposited and formed in an electrodeposition manner.

Optionally, the electrodeposition is performed in a three electrode electrochemical cell with an InGaN working electrode, an Ag/AgCl reference electrode, and a Pt counter electrode, wherein a following electrolytic reaction is conducted at the InGaN working electrode so as to form the $Cu_2O$ layer:

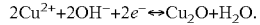

Optionally, an electrolyte in the electrolytic reaction is an aqueous solution of $Cu_2SO_4$.

The InGaN-based LED epitaxial wafer in the present disclosure at least includes three layers of structure: the substrate, the InGaN layer, and the p-type metal oxide layer in sequence. Since the p-type metal oxide (especially $Cu_2O$) can readily realize high p-type conductivity, and quite high hole mobility, it can effectively act as the hole injection layer of the InGaN layer, so as to avoid use of low-In-content wide bandgap p-type InGaN or pure GaN in the prior art as hole injection layer.

Besides, the p-type metal oxide layers usually have a relatively small energy gap (mostly about 2 eV), compared with the prior art using the low-In-content wide bandgap p-type InGaN or pure GaN, fabricated LEDs are allowed to have a lower operation voltage and higher lighting efficiency.

In the fabrication method for the LED epitaxial wafer in the present disclosure, the p-type $Cu_2O$ layer is further formed on the InGaN layer in the electrodeposition manner. The fabrication method is simple in operation, and avoids the step of fabricating the hole injection layer at a high temperature in the prior art, which protects the InGaN layer against high-temperature damage while forming the hole injection layer.

According to the detailed description to embodiments of the present disclosure below in conjunction with accompanying drawings, at least one of the above and other objects, advantages, and features of the present disclosure would be clearer to a person skilled in the art.

BRIEF DESCRIPTION OF DRAWINGS

Some embodiments of the present disclosure will be described in detail hereinafter with reference to accompanying drawings in an exemplary but non-restrictive way. The same reference signs refer to the same or similar parts or portions in the accompanying drawings. A person skilled in the art should understand that these accompanying drawings are not necessarily drawn to scale. In the accompanying drawings:

FIG. 1b is a schematic diagram of growing an InGaN layer on the substrate shown in FIG. 1a;

DETAILED DESCRIPTION OF EMBODIMENTS

Firstly, the present embodiment provides an InGaN-based LED epitaxial wafer. Two classes of materials, namely III-nitride semiconductors and p-type metal oxides, are combined. In the present embodiment, the III-nitride semiconductors are just InGaN. A p-type metal oxide layer 13 replaces a (In)GaN wide bandgap layer in the prior art, thus avoiding use of (In)GaN wide bandgap hole injection layers.

Figure 1A:
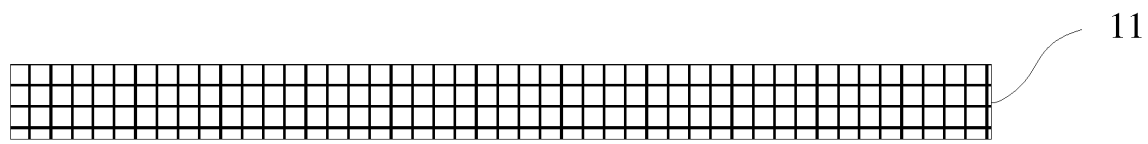
FIG. 1a is a schematic diagram of a substrate of an LED epitaxial wafer according to one embodiment of the present disclosure.
Figure 1B:
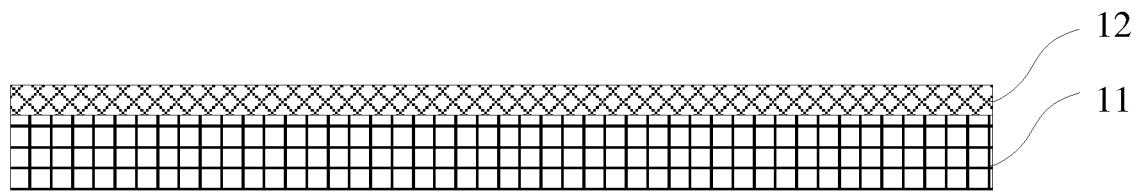
Figure 1C:
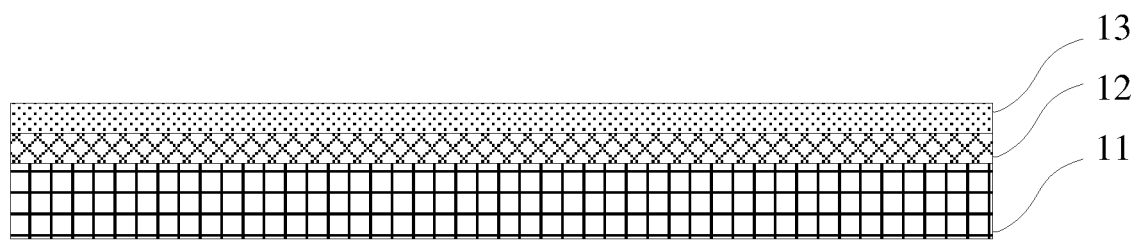
FIG. 1c is a schematic diagram of the LED epitaxial wafer according to one embodiment of the present disclosure.
Figure 2:
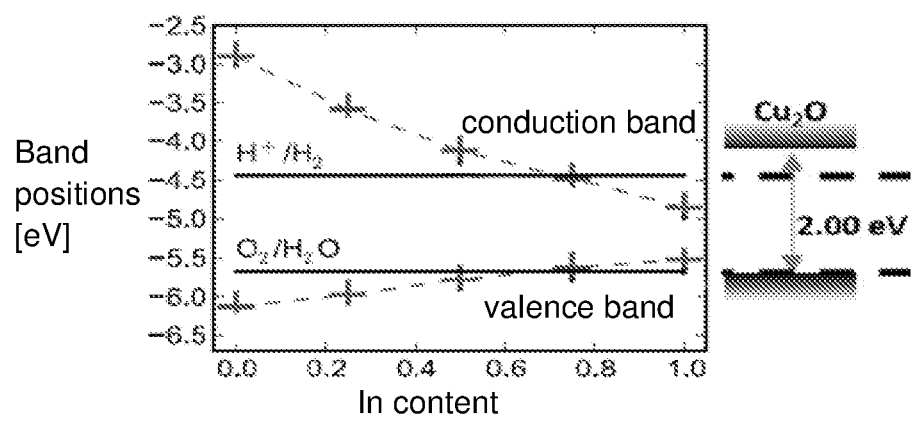
FIG. 2 is a schematic diagram showing comparison of energy band positions of InGaN as a function of In content therein and energy band positions of $Cu_2O$.

Specifically, the InGaN-based LED epitaxial wafer in the present embodiment at least includes three layers of structure, as shown in FIG. 1c: a substrate 11, an InGaN layer 12, and a p-type metal oxide layer 13 in sequence, wherein a material of the substrate 11 may be one selected from sapphire, Si, SiC, and GaN, and a Si substrate 11 is preferred in the present embodiment. The InGaN layer 12 is formed on a surface of the substrate 11, with an In content between 40% and 90%, so as to ensure that the LED epitaxial wafer can emit long-wavelength light or near-infrared rays. Inventors found in tests that when the In content is between 45% and 50%, the LED epitaxial wafer can emit red long-wavelength light, and when the In content reaches 80-90%, the LED epitaxial wafer can emit rays with near-infrared bands. Specifically referring to FIG. 2, FIG. 2 shows magnitude of the InGaN bandgap corresponding to different In contents, wherein the magnitude of the bandgap determines energy (i.e. wavelength or color of light) of light that can be emitted from LED subsequently fabricated. LED manufactures can determine and set the In content in the InGaN layer 12 according to the color of light that needs to be emitted by the LED.

The p-type metal oxide layer 13 is formed on a surface of the InGaN layer 12 facing away from the substrate 11, acting as a hole injection layer for the InGaN layer 12. The metal oxide can readily realize high p-type conductivity, and quite high hole mobility, such that it can effectively act as the hole injection layer of the InGaN layer 12. The above metal oxide may be oxides of Cu, for example, CuO, $CuFeO_2$, $CuRhO_2$, $Cu_3VO_4$, $CuNb_3O_8$, $Cu_2Nb_8O_{21}$, $CuNbO_3$, $Cu_3Ta_7O_{19}$, $Cu_5Ta_{11}O_{30}$, $CuGaO_2$, and $CuGaSe_2$, and also may be non Cu oxides, for example, $CaFe_2O_4$, $ZnRh_2O_4$, and $ZnCo_2O_4$. However, taking factors such as hole mobility, band offsets, and ease of fabrication into consideration, $Cu_2O$ is preferred in the present embodiment.

In $Cu_2O$ high p-type conductivity is easily achievable such that it acts as an efficient hole injection layer. As tested by the inventors, the hole mobility thereof can reach 100 $cm^2/Vs$ which is the largest for all p-type metal oxides. Besides, as shown in FIG. 2, the bandgap energy of $Cu_2O$ is only 2 eV (orange). This avoids large bandgap differences with the In-rich InGaN layer. Therefore, the relatively low bandgap energy of $Cu_2O$, in principle, allows the fabricated LED to operate at a relatively low operation voltage. Meanwhile, above all, the band alignment of $Cu_2O$ straddles In-rich InGaN (see FIG. 2), therefore, it is easier for holes to enter the InGaN layer 12 from the $Cu_2O$ layer, such that the $Cu_2O$ layer satisfies the condition of acting as the hole injection layer of the In-rich InGaN layer 12.

Besides, for InGaN semiconductors, electrons migrate much faster than holes, and have a high concentration, and numerous electrons migrate to the hole injection layer to be recombined with holes, but in this way, required light emission in the InGaN layer cannot be obtained, which is an intrinsic loss mechanism. In the present disclosure, due to the introduction of the $Cu_2O$ layer as the hole injection layer, there is a larger band offset in the conduction band (as shown in FIG. 2, especially in the In-rich InGaN, the band offset between the conduction band of $Cu_2O$ and the conduction band of InGaN is relatively large), thus, $Cu_2O$ functions as an electron blocking layer to avoid electron overflow, and prevent loss of the above electrons. This is because the above band offset establishes an energy barrier for electron motion from the In-rich n-type InGaN part into the $Cu_2O$ layer, reflecting the electrons back into the In-rich n-type InGaN, wherein they radiatively recombine with injected holes from the $Cu_2O$ layer in the In-rich InGaN layer 12, so as to achieve optimal light emitting effect. At the same time the hole injection stays efficient as there is no energy barrier for holes for motion from the $Cu_2O$ layer into the In-rich n-type InGaN, and the holes can be easily injected from the $Cu_2O$ layer into the In-rich InGaN layer 12, so as to be recombined with the electrons in the InGaN layer 12.

Further, $Cu_2O$ is readily fabricated at a low temperature (e.g., at a room temperature) by, e.g., electrodeposition, thermal growth or sputter deposition, and it is ensured that $Cu_2O$ grows epitaxially on InGaN, which avoids fabricating the hole injection layer at a high temperature in the prior art, and protects the InGaN layer 12 against high-temperature damage.

To sum up, $Cu_2O$ fulfills all requirements to act as hole injection layer for the In-rich InGaN-based LEDs, and is capable of replacing wide bandgap (In)GaN hole injection layers in the prior art.

Other alternative Cu-based p-type oxides with similar band alignment can substitute $Cu_2O$, for example, CuO (1.4 eV), $CuFeO_2$ (1.36 eV), $CuRhO_2$ (1.9 eV), $Cu_3VO_4$ (1.2 eV), $CuNb_3O_8$ (1.26 eV), $Cu_2Nb_8O_{21}$ (1.43 eV), $CuNbO_3$ (2.0 eV), $Cu_3Ta_7O_{19}$ (2.6 eV), $Cu_5Ta_{11}O_{30}$ (2.55 eV), $CuGaO_2$ (1.5 eV), and $CuGaSe_2$ (1.7 eV). Also there are other non-Cu-containing p-type oxides, for example, $CaFe_2O_4$ (1.9 eV), $ZnRh_2O_4$ (2.0 eV), and $ZnCo_2O_4$ (2.3 eV). Values within brackets represent corresponding bandgap energies. However, taking factors such as hole mobility, band offsets, and ease of fabrication into consideration, $Cu_2O$ is the most preferred.

Figure 3:
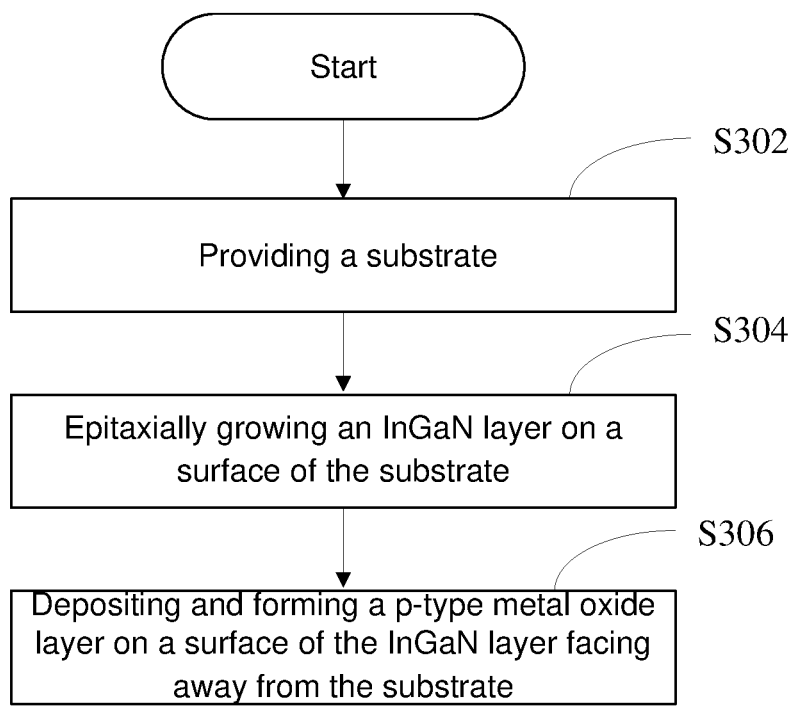
FIG. 3 is a flowchart of a fabrication method for an LED epitaxial wafer according to one embodiment of the present disclosure.

The present embodiment further provides a fabrication method for InGaN-based LED epitaxial wafer. As shown in FIG. 3, it generally includes several steps as follows:

Step S302: providing a substrate 11. As shown in FIG. 1a, the material of the substrate 11 may be one selected from sapphire, Si, SiC, and GaN, and a Si substrate 11 is preferred in the present embodiment. Before an InGaN layer 12 is grown epitaxially, the substrate 11 might need to be subjected to pretreatment such as ultrasonic cleaning or high-temperature heating, of which specific steps are well-known to a person skilled in the art, and will not be described in detail herein.

Step S304: epitaxially growing the InGaN layer 12 on a surface of the substrate 11. As shown in FIG. 1b, the InGaN layer 12 in FIG. 1b is epitaxially grown on the substrate 11. By epitaxial growth, it means growing on the monocrystalline substrate 11 a monocrystalline layer meeting certain requirements and having a well defined crystallographic relationship with the substrate 11, as expanding the original wafer outwards to a certain extent. Epitaxial growth is a new technology of fabricating monocrystalline thin films, which is a method of growing thin films layer by layer on the appropriate substrate 11 under suitable conditions along a direction of crystallographic axis of the material of the substrate 11. This technology has following advantages: a low temperature of the substrate 11 in use, a slow growth rate of films and layers, easy and precise control over beam current intensity, and capability of quickly adjusting components, composition and doping concentration of films and layers with variation of sources. With such technology, a monocrystalline thin film with a thickness of tens of atomic layers can be fabricated, and ultrathin layered materials with a quantum microstructure are formed by alternately growing thin films having different components and doped with different methods. The above epitaxial growth method can be molecular beam epitaxy or metalorganic vapor phase epitaxy method. The molecular beam epitaxy is a newly developed epitaxial film-making method, and is also a special vacuum coating process. The metalorganic compound vapor phase epitaxy is a non-equilibrium growth technology, and relies on gas source transmission and pyrolysis reaction to be realized, with synthesis and decomposition taking place simultaneously. When hydrogen carries metalorganic compound vapors and non-metallic hydrides to be over the substrate 11 heated inside a reaction chamber, a series of chemical reactions take place and an epitaxial layer is generated on the substrate 11.

The InGaN structure can be a homogeneous semiconductor of uniform In content or heterostructure with varying In content of any design and morphology, e.g. planar layer, corrugated layer, nanowall network, nanocolumns. As to the so-called semiconductor heterostructure, semiconductor thin films of different materials are deposited in sequence on the single substrate 11. Since the semiconductor heterostructure can restrict electrons and holes within an intermediate layer, a recombination rate of the electrons with the holes is increased, then the lighting efficiency is relatively high; at the same time, lighting frequency can be controlled by changing width of quantum wells, therefore, current semiconductor light-emitting devices are mostly based on a heterostructure.

In the above, the In content in InGaN is between 40% and 90% (i.e. In-rich InGaN). The In content can be adjusted by a Ga-to-In flux/flow ratio. A growth temperature of InGaN is between 300 and 600° C. The InGaN layer 12 has a growth rate between 0.1 and 1 micrometer per hour.

Step S306: depositing and forming a p-type metal oxide layer 13 on a surface of the InGaN layer 12 facing away from the substrate 11. A manner of depositing and forming the p-type metal oxide layer 13 is selected from thermal growth, sputtering, and electrodeposition.

In the present embodiment, the p-type metal oxide layer 13 is a $Cu_2O$ layer; and the p-type metal oxide layer 13 is deposited and formed in an electrodeposition manner. Specifically, electrodeposition is performed in a three electrode electrochemical cell with an InGaN structure used as working electrode, an Ag/AgCl reference electrode, and a Pt counter electrode. The growth temperatures are between a room temperature and 80° C., and the growth temperatures thereof can be controlled, e.g., by a hot plate and water bath. Preferred electrolytes are aqueous solutions of 0.1-0.4 M cupric sulfate ($Cu_2SO_4$) plus 1-3 M lactic acid (from e.g. Sigma Aldrich). This forms a copper lactate complex to stabilize $Cu^{2+}$ ions. The pH is adjusted to 7-13, preferably 9-12, by adding concentrated (e.g. 3-5 M) alkaline aqueous solutions of, e.g., NaOH or KOH. Deposition voltages are −0.3 to −0.6 V versus the Ag/AgCl reference electrode, controlled by a voltage source (e.g. a Keithley 2400 Source meter). $Cu_2O$ has a growth rate between 100 and 1000 nanometers per hour, depending on voltage and temperature. Preferably, a $Cu_2O$ layer grown has a thickness of 10-500 nm. The growth on the InGaN working electrode takes place according to the redox half reaction with transfer of two electrons $e^-$, that is:

$$2Cu^{2+}+2OH^-+2e^- \leftrightarrow Cu_2O+H_2O$$

After the electrodeposition of the $Cu_2O$ layer is completed, the LED epitaxial wafer in the present disclosure is obtained.

Besides, it further may need to test the fabricated LED epitaxial wafer. For LED testing, a metal contact pattern may need to be deposited on the $Cu_2O$ layer, which is formed in a manner such as photolithography, metal deposition, and lift-off. The above metal can be Al, Au, Ni, and preferably Pt. The patterns can be periodic stripe or crossed periodic stripe patterns with 5-10 micrometer stripe width. Annealing is performed at 200-400° C. for 5-10 min for ohmic contact formation. A layer structure is cleaved into, e.g., 0.1×0.1 to 1×1 cm², preferably 0.4×0.4 to 6×6 cm² dices, for further fabricating LED testing devices.

So far, a person skilled in the art should recognize that, although multiple exemplary embodiments of the present disclosure have been shown and described in a detailed way herein, without departing from the spirit and scope of the present disclosure, many other alterations or modifications conforming to the principle of the present disclosure still can be directly determined or inferred according to the contents disclosed in the present disclosure. Therefore, the scope of the present disclosure should be construed and deemed as covering all of these other alterations or modifications.

What is claimed is:

1. An Indium Gallium Nitride-based LED epitaxial wafer, comprising:
   a substrate;
   an Indium Gallium Nitride layer, formed on a surface of the substrate, having an In content between 40% and 90%, so as to ensure that the LED epitaxial wafer is capable of emitting long-wavelength light or near-infrared rays; and
   a p-type metal oxide layer, formed on a surface of the Indium Gallium Nitride layer facing away from the substrate, acting as a hole injection layer for the Indium Gallium Nitride layer.

2. The Indium Gallium Nitride-based LED epitaxial wafer of claim 1, wherein the p-type metal oxide layer is a Cu2O layer.

3. The Indium Gallium Nitride-based LED epitaxial wafer of claim 1, wherein the Indium Gallium Nitride layer is a homogeneous layer of uniform In content or a heterostructure layer of varying In content.

4. The Indium Gallium Nitride-based LED epitaxial wafer of claim 1, wherein a material of the substrate is one selected from sapphire, Si, SiC, and GaN.

5. The Indium Gallium Nitride-based LED epitaxial wafer of claim 1, wherein the p-type metal oxide has to be chosen that the p-type metal oxide layer has a bandgap which straddles the bandgap of the Indium Gallium Nitride layer, so as to ensure hole injection efficiency of the p-type metal oxide layer.

6. A fabrication method for an Indium Gallium Nitride-based LED epitaxial wafer according to claim 1, comprising:
   providing a substrate;
   epitaxially growing an Indium Gallium Nitride layer on a surface of the substrate; and
   depositing and forming a p-type metal oxide layer on a surface of the Indium Gallium Nitride layer facing away from the substrate.

7. The fabrication method of claim 6, wherein a manner of depositing and forming the p-type metal oxide layer is one selected from:
   thermal growth, sputtering, and electrodeposition.

8. The fabrication method of claim 7, wherein the p-type metal oxide layer is a $Cu_2O$ layer; and
   the p-type metal oxide layer is deposited and formed in an electrodeposition manner.

9. The fabrication method of claim 8, wherein the electrodeposition is performed in a three electrode electrochemical cell with an Indium Gallium Nitride working electrode, an Ag/AgCl reference electrode, and a Pt counter electrode, wherein
   a following electrolytic reaction is conducted at the Indium Gallium Nitride working electrode so as to form the Cu2O layer:

$$2Cu^{2+}+2OH-+2e-\leftrightarrow Cu_2O+H_2O.$$

10. The fabrication method of claim 9, wherein an electrolyte in the electrolytic reaction is an aqueous solution of $Cu_2SO_4$.

* * * * *